United States Patent [19]

Arbeiter

[11] Patent Number: 4,815,023
[45] Date of Patent: Mar. 21, 1989

[54] QUADRATURE MIRROR FILTERS WITH STAGGERED-PHASE SUBSAMPLING

[75] Inventor: James H. Arbeiter, Hopewell, N.J.

[73] Assignee: General Electric Company, Schenectady, N.Y.

[21] Appl. No.: 45,986

[22] Filed: May 4, 1987

[51] Int. Cl.[4] ............................................. G06F 15/31
[52] U.S. Cl. ................................................ 364/724.01
[58] Field of Search ................ 364/724, 724.01, 724.1, 364/724.13, 724.18, 724.17

[56] References Cited

U.S. PATENT DOCUMENTS 4,701,874 10/1987 Akai et al. ............................ 364/724

OTHER PUBLICATIONS

*Multirate Digital Signal Processing*, R. E. Crochiere and L. R. Rabiner, pp. 376–395, Prentice Hall, Englewood Cliffs, N.J. 1983.
"Direct Approach To Quasi Perfect Decomposition of Speech In Sub-Bands", D. Esteban, and C. Galand, p. 852, 9th International Congress on Acoustics, Madrid, 1977.
"New Quadrature Mirror Filter Structures", C. R. Galand and H. J. Nussbaumer, 0096-3518/84/0600-0522 $01.00 copyrighted 1984 IEEE.
"HQMF: Halfband Quadrature Mirror Filters", D. Esteban and C. Galand, CH/1610-5/81/0000-0220 $00.75 copyrighted 1981 IEEE.
"Multi-dimensional Sub-band Coding: Some Theory and Algorithms", M. Vetterli 0165-1683/84/$3.00 copyrighted 1984 Elsevier Science Publishers B.V. (North-Holland).
"An Efficient Image Representation For Multiscale Analysis", Stephane Mallat, pp. 172–175, Optical Society of America, Topical Meeting on Machine Vision, Mar. 18-20, 1987.

*Primary Examiner*—Gary V. Harkcom
*Assistant Examiner*—Dale M. Shaw
*Attorney, Agent, or Firm*—William Squire; James C. Davis, Jr.; Paul R. Webb, II

[57] ABSTRACT

By staggering the phases of the decimations of the subbands in a quadrature mirror filter bank odd-tap kernels may be usefully employed.

3 Claims, 5 Drawing Sheets

QUADRATURE MIRROR FILTERS WITH STAGGERED-PHASE SUBSAMPLING

The invention concerns new classes of quadrature mirror filters as used in subband coding.

BACKGROUND OF THE INVENTION

In subband coding a wideband signal in the frequency domain is subjected to a spectrum analysis procedure to apportion its energy content among a plurality of subbands, which are individually coded. The coding procedures usually involve decimation. The coding procedures may include different quantizing thresholds for the various subbands. The coding procedures may involve statistical coding. The codes are transmitted and are decoded to recover the spectrum analyses. Decimated subband information is expanded through interpolation and combined to synthesize a replica of the original wideband signal.

A type of filtering called quadrature mirror filtering is well adapted for use in subband coding and in other signal processing that involves the spectral analysis of a wideband signal, operation on the subspectra, and the synthesis of a wideband signal from the operated on subspectra. A quadrature-mirror-filter (QMF) bank of filters divides a band of n-dimensional frequencies into $2^n$ subbands with cross-overs in response between subbands at exactly one-half Nyquist frequency. Each subband is subsampled 2:1 in each of the n dimensions as compared to the band from which it was separated by the QMF. The number n is a positive integer. The number n is one, when simple temporal frequencies or linear spatial frequencies are being filtered. The number n is two when transversal filtering of temporal frequencies is involved or when there is direct two-dimensional spatial frequency filtering involved. The quadrature mirror filters are complementary in their responses, each exhibiting 6 dB attenuation at half Nyquist frequency in a dimension, so that summing their responses (after resampling them to the density of samples in the band supplied to the QMF bank) provides an all-pass network. The low-pass subband and high-pass subband portions of filter response $H(z)$ and $H(-z)$ in each of the n dimensions have frequency spectra that are complements of each other and sum to a flat response.

A primer for QMF bank design is found in Subchapter 7.7 "Filter Banks Based On Cascaded Realizations and Tree Structures" on pages 376–395 of the book MULTIRATE DIGITAL SIGNAL PROCESSING by R. E. Crochiere and Lawrence R. Rabiner published by Prentice-Hall Inc., Englewood Cliff N.J. 07632. As pointed out on page 383 of this book the low-pass filter kernels and high-pass filter kernels, which are used in conventional quadrature mirror filters of symmetric finite impulse response (FIR) type, invariably have an even number of taps in order to be useful. The low-pass filters exhibit cosine (or even) symmetry, of course, but the high-pass filters exhibit sine (or odd) symmetry. Subsampling of each filter response is done in phase with that of the other. Crochiere and Rabiner indicate that a set of conditions for QMF bank design alternative to conventional practice do exist, however, which allow the use of filter kernels that have an odd number of taps.

C. R. Galand and H. J. Nussbaumer in their paper "New Quadrature Mirror Filter Structures" appearing on pages 522–531 of IEEE TRANSACTIONS ON ACOUSTICS, SPEECH, AND SIGNAL PROCESSING, Vol. ASSP-32, No. 3 June 1984 include a section "IV. Odd Quadrature Mirror Filters." They describe modifications of the conventional QMF banks, introducing a one-sample delay in the high-pass filter of the synthesizing QMF bank used to separate the input signal into subbands, and introducing a one-sample delay in the low-pass filter of the analyzing QMF bank used to reconstruct the input signal from the subbands, which modifications accommodate the use of filter kernels with odd numbers of taps. Decimations of the low-pass and high-pass filter responses are done in phase.

G. Wackersreuther in his paper "On The Design Of Filters For Ideal QMF and Polyphase Filter Banks" appearing in pp. 123–130 of ARCHIV FOR ELECTRONIK UND UBERTRAGUNSTECHNIK, Vol. 39, No. 2, February 1985, describes an alternative configuration to that suggested by Galand and Nussbaumer, in which alternative configuration decimations of the low-pass and high-pass filter responses are done out-of-phase, thus eliminating the need for one-sample delays to accommodate the use of filter kernels with odd numbers of taps.

SUMMARY OF THE INVENTION

Subsampling of the subbands in staggered phasing, rather than in the same phasing, makes possible compact new structure for quadrature mirror filters the present inventor finds. A quadrature mirror filter bank is made possible, that has a low-pass filter kernel with an odd number of taps and cosine (or even) symmetry, that has a high-pass filter kernel with an odd number of taps and cosine (or even) symmetry, and that has no need for offset between the low-pass and high-pass filter kernels. This permits low-pass and high-pass filtering both to be done sharing a single tapped delay line structure and tap-weight multipliers.

DETAILED DESCRIPTION

Figure 1:
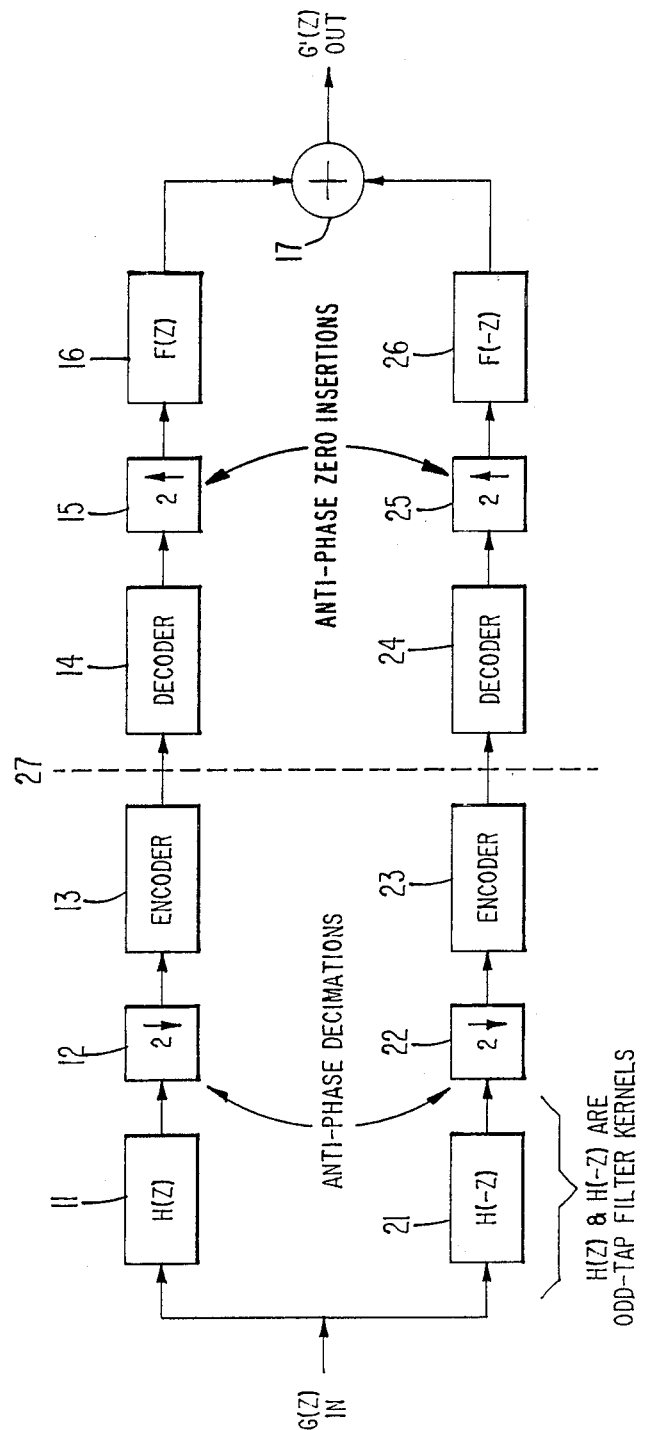
FIG. 1 is a schematic diagram of apparatus for one-dimensional subband encoding and decoding in which one may use the apparatus of the invention.

FIG. 1 shows simple one-dimensional subband encoding as performed in accordance with the Wackersreuther paper. An input signal regularly sampled in a single dimension linearly mapped into quantized time is denominated $G(z)$. $G(z)$ is low-pass filtered and high-pass filtered in convolvers 11 and 21, respectively, by convolving $G(z)$ with kernels $H(z)$ and $H(-z)$, respectively. $H(z)$ and $H(-z)$ are complementary, linear-phase filter functions with a cross-over at half the $G(z)$ sampling rate, where each of them exhibits $-6$ db attenuation, much as in any other QMF bank.

H(z) has an odd number N of taps and exhibits cosine, or even, symmetry in its tap weights. H(−z) has an odd number N of taps and exhibits cosine, or even, symmetry in its tap weights. The subsequent 2:1 decimations of the convolution result G(z) * H(z) from convolver 11 and the convolution result G(z) * H(−z) from convolver 21 are performed out-of-phase in decimators 12 and 22 prior to their being subband encoded in encoders 13 and 23, respectively.

The out-of-phase decimation processes provided by decimators 12 and 22 interleave their respective subsample outputs in time. Accordingly, where encoders 13 and 23 are similar in their operation, a simple encoder may replace them, and decimators 12 and 22 may be replaced by a time-division multiplexer alternately supplying the single encoder G(z) * H(z) and G(z) * H(−z) at G(z) sample rate. Return consideration now to the subband encoding arrangement exactly as shown in FIG. 1.

Assume decimated G(z) * H(z) and G(z) * H(−z) signals are recovered perfectly from the codes generated by encoders 13 and 23 by corresponding decoders 14 and 24, respectively, and are up-sampled in elements 15 and 25, respectively, to the original sampling rate for G(z). This up-sampling is carried out in element 15 by interleaving null samples with decimated G(z) * H(z) samples when they do not exist, but decimated G(z) * H(−z) samples do. This upsampling is carried out in element 25 by interleaving null samples with decimated G(z) * H(−z) samples when they do not exist, but decimated G(z) * H(z) samples do. That is, the insertions of null samples in the two signals is on an out-of-phase basis, rather than being on an in-phase basis. The signals from the up-samplers 15 and 25, each contain a set of frequency components below half Nyquist rate and a set of frequency components above half Nyquist rate. In each signal only one of its sets of frequency components is valid; the other set is an alias resulting from the down-sampling followed by up-sampling procedure.

In the signal from up-sampler 15, the other set of frequency components below half Nyquist rate is valid and is separated from its alias by convolving the signal with a low-pass filter kernel F(z) in convolver 16. In the signal from up-sampler 25, the set of frequency components above half Nyquist rate is valid and is separated from its alias by convolving the signal with a high-pass filter kernel F(−z) in convolver 26. The convolution results from convolvers 16 and 26 are summed in an adder 17 to obtain an output signal G′ (z) that is a replica of the original input G(z).

F(z) and F(−z) are complementary in their filtering characteristics, having a cross-over in response at half Nyquist rate. If H(z) is suitably chosen, it may be used as F(z) as well. This is attractive to do when the same digital hardware is used on a transmit/receive basis for both subband encoding and subband decoding. One should understand that the subband encoding thusfar described where an original band is divided into two subbands can be performed in cascade, to subdivide the subbands and generate tree structures.

An interface 27 between encoders 13, 23 and decoders 14, 24 is established by dotted line in FIG. 1, to help in relating it to FIGS. 2 and 3 later on. A variety of signal transmitting means may be introduced at interface 27, of course. Where encoders 13 and 23 are replaced by a single encoder receiving time-multiplexed convolution results from convolvers 11 and 12, an alternative described previously, interface 27 may be single-channel rather than double-channel in nature. Decoders 14 and 24 can then be replaced by a single decoder and a multiplexer time-division-multiplexing the single decoder output to up-samplers 15 and 25 at original G(z) sample rate.

The degree to which G′ (z) output signal is an exact replica of G(z) input signal depends on a number of factors, the same factors that determine accuracy in subband encoding with prior-art QMF banks. It depends on the degree to which decoders 14 and 24 perfectly recover the input signals to their corresponding encoders 13 and 23, of course, and on the resolution maintained in digital arithmetic operations. It also depends on the perfection of the low-pass and high-pass filtering operations carried out in the subband encoding procedure. That is, care has to be exercised in the choice of H(z), H(−z), F(z) and F(−z) kernels. As in conventional QMF bank design, the selection of optimal kernels is an onerous procedure, usually carried on with the aid of computers.

Seven-tap kernels which result in an output signal that is a very accurate, though not exact, replica of the input signal when used directly for H(z), H(−z) and when doubled before use as F(z), F(−z) are tabulated below.

| Tap No. | Low-Pass | High-Pass |
|---|---|---|
| −3 | −0.00523 | 0.00523 |
| −2 | −0.05175 | −0.05175 |
| −1 | 0.25523 | −0.25523 |
| 0 | 0.60351 | 0.60351 |
| 1 | 0.25523 | −0.25523 |
| 2 | −0.05175 | −0.05175 |
| 3 | −0.00523 | 0.00523 |

Five-tap kernels which are good for H(z), H(−z) and with doubling for F(z), F(−z) are tabulated below.

| Tap No. | Low-Pass | High-Pass |
|---|---|---|
| −2 | −0.05381 | −0.05381 |
| −1 | 0.25000 | −0.25000 |
| 0 | 0.60763 | 0.60763 |
| 1 | 0.25000 | −0.25000 |
| 2 | −0.05381 | −0.05381 |

These five-tap kernels are particularly attractive in that the weighting by 0.25 and by −0.25 can be carried out simply by shifting two binary places, avoiding the need for more complicated multipliers. The reason (Fz) and F(−z) are made twice as large as H(z) and H(−z) is to compensate for the energy loss associated with 2:1 decimation. If one wishes kernels that can be used directly both for H(z), H(−z) and for F(z), F(−z) the set of kernels set forth above can be modified by multiplication of each tap weight by square root of two. The QMF filters using odd-tap kernels tend to be more compact in structure than the QMF filters using even-tap kernels.

Figure 2:
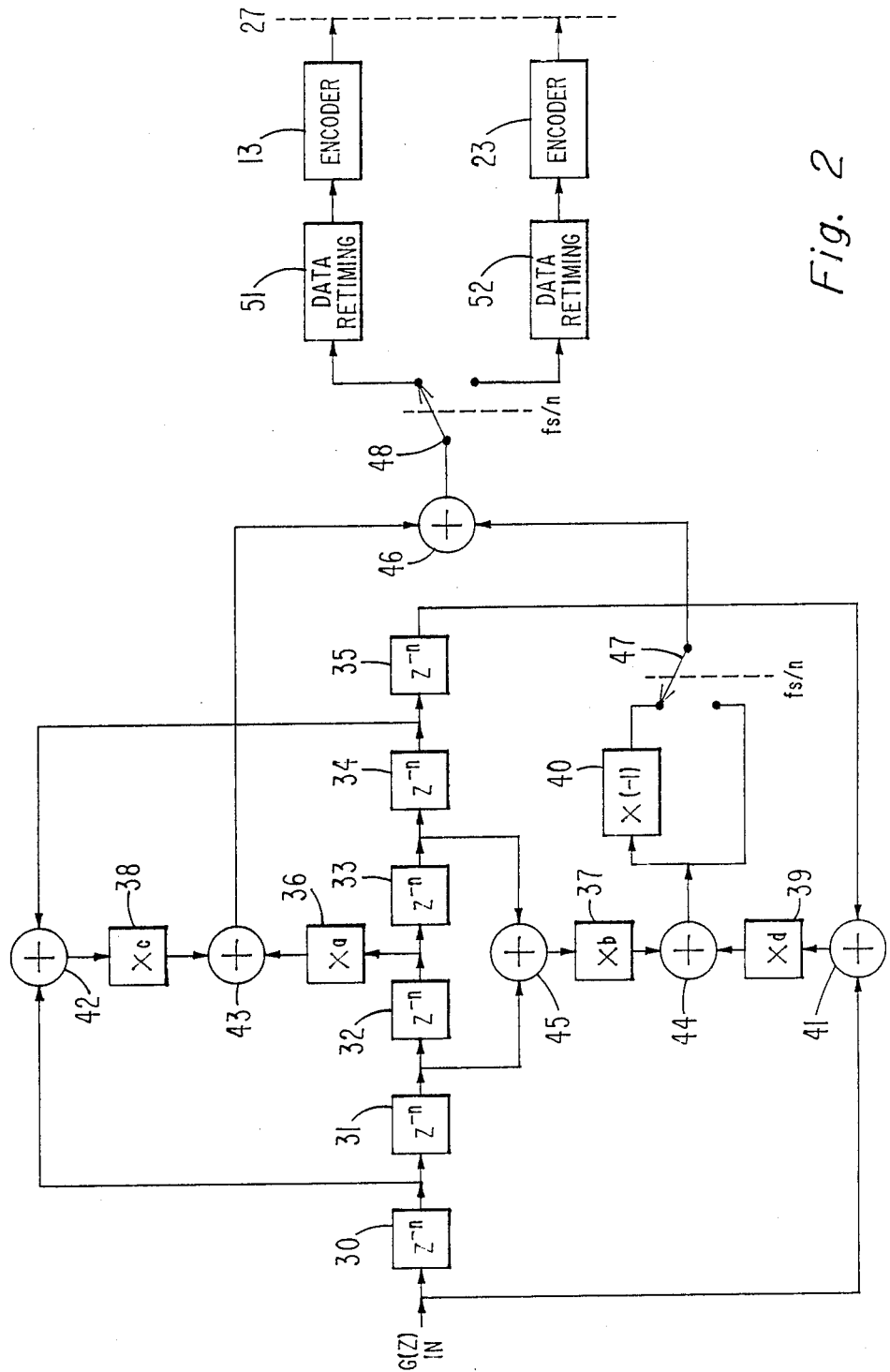
FIG. 2 is a schematic diagram of apparatus for one-dimensional subband encoding, in accordance with the invention.

FIG. 2 shows a subband coding encoding apparatus constructed according to the invention. The QMF bank filters are output weighted and have seven-tap kernels. The low-pass filter in the QMF bank has its input signal in alignment with that of the high-pass filter in the QMF bank, and has its output signal in alignment with that of the high-pass filter in the QMF bank. There is no need for an extra $z^{-n}$ clocked delay element in the QMF bank to accommodate the low-pass and high-pass filter kernels having odd numbers of taps, so six segments of cascaded $z^{-n}$ delay 30-35 suffice to support seven-tap filtering, where n is an integer. When n is unity-valued in a normal one-dimensional filter, the saving of a $z^{-n}$ clocked delay element is usually of negligible advantage. However, in transversal filtering, where the input signal is raster-scanned over two-dimensions in rows of n samples, and where n is larger than one, often by factors of a few hundred or so, the saving of $z^{-n}$ clock delay elements can be very significant.

The FIG. 2 kernels take the form tabulated below.

| Tap. No. | Low-Pass | High-Pass |
|---|---|---|
| −3 | d | −d |
| −2 | c | c |
| −1 | b | −b |
| 0 | a | a |
| 1 | b | −b |
| 2 | c | c |
| 3 | d | −d |

Full advantage is taken of the symmetries encountered in the kernels, to reduce the number of multipliers and two-addend adds involved. There are only four digital multipliers 36, 37, 38 and 39 required for multiplying by tap weights a, b, c and d, respectively. (The polarity inverter 40 usually comes free as a part of adder 44.) There are only six two-addend adders 41-46 required in the FIG. 2 QMF bank. Of particular interest is the fact that the staggered phasing of the subbands eliminates the need for separate adders to perform addition and subtraction of the even and odd samples of the filtering; one adder 46 (together with complementor 40 and sampling switch 47) performs both functions on a time-division-multiplex basis. Two sampling switches 47, 48 are used for subband coding from samples at $f_s$ rate. If the subbands are time-division-multiplexed for coding by a single encoder, sampling switch 48 can be dispensed with.

The data retiming circuits 51 and 52 comprise respective data latches clocked at f/2 rate, if n equal one. When n is a large number in transversal filtering data retiming circuits 51 and 52 comprise memories read at twice slower rate than written to maintain uniform data flow at $f_s/2$ sample rate to the encoders 13 and 23. This avoids groups of n data samples each being time interleaved with groups of n null samples each, at $f_s$ sample rate.

Figure 3:
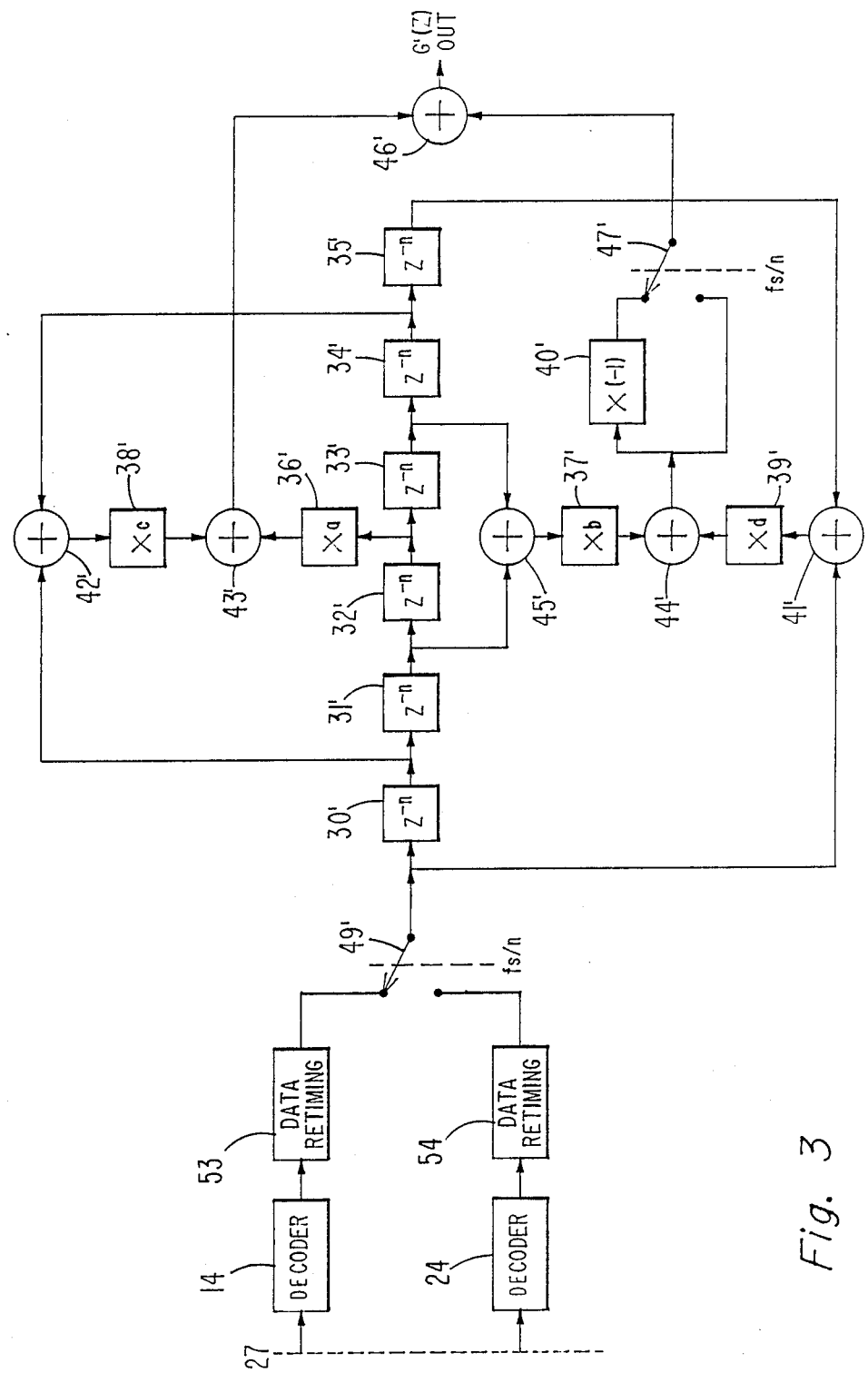
FIG. 3 is a schematic diagram of apparatus for decoding the subband encoding of the FIG. 2 apparatus, in accordance with the invention.

FIG. 3 shows a subband coding decoder apparatus constructed according to the invention, for use with the FIG. 2 subband coding encoder. Data retiming circuits 53 and 54 are used, if necessary, to retime data supplied from decoders 14 and 24, respectively, to synchronism with the data supplied to data retiming circuits 51 and 52, respectively. Where n=1, circuits 53 and 54 are unnecessary and are replaced by straight-through connections. When the FIG. 2 encoding apparatus and FIG. 3 decoding apparatus are elements in coding trees, data retiming circuits 51-54 can include the clocked delay elements needed for proper temporal alignment of parallel data paths.

Returning attention to the FIG. 3 decoding apparatus, the data from data retiming circuits 53 and 54 are alternately sampled at $f_s/n$ rate by sampling switch 49 to supply input samples for a QMF bank comprising elements 30'-47' corresponding to elements 30-47 in the QMF bank in the FIG. 2 subband coding encoder. (This alternate sampling is unnecessary where time-division-multiplexed encoding has been done, the encoded signal has been transmitted in time-division multiplex, and the time-division multiplexed signal has been decoded using one decoder. In such case sampling switch 49' is dispensed with.) A replica $G'(z)$ of the input signal $G(z)$ supplied as input signal to the FIG. 2 encoder appears at the sum output of adder 46' in the FIG. 3 decoding apparatus.

The one-dimensional QMF banks thus far described may be used as the basis for constructing separable plural-dimensional QMF banks. The odd-order kernels may be used in each of the dimensions, with decimations staggered in phase in each dimension, in one class of plural-dimension QMF banks. In other classes of plural-dimension QMF banks odd-order kernels may be used in one (or some) of the dimensions, together with decimations staggered in phase in that (or those) of the dimensions; and an even-order kernel may be used in each remaining dimension, together with in-phase decimation in each remaining dimension. Two-dimensional QMF banks using the same odd-order kernels in both orthogonal dimensions are of particular interest in the coding of raster-scanned television images.

Figure 4:
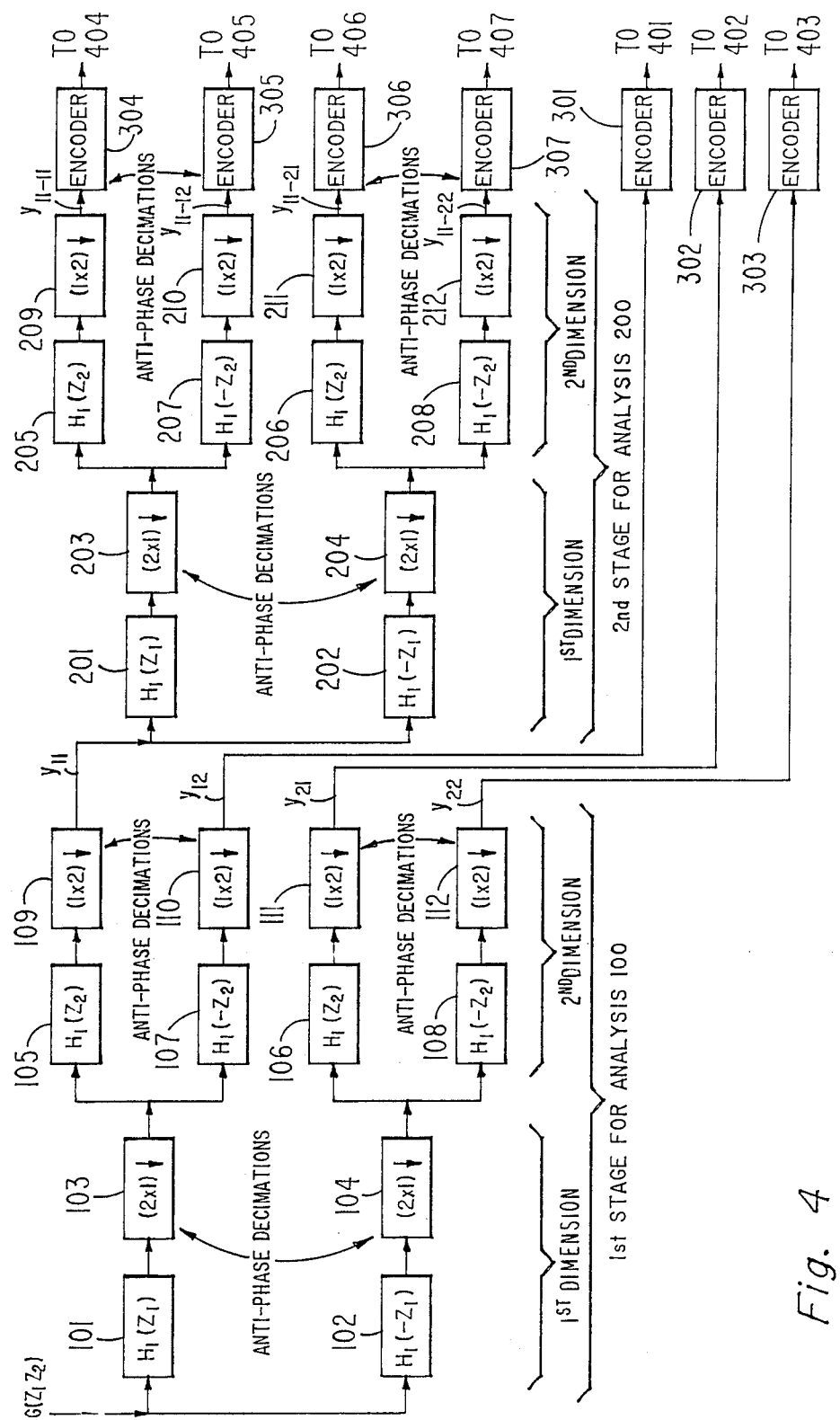
FIG. 4 is a schematic diagram of apparatus for two-dimensional subband encoding, in which one may use the apparatus of the invention.

FIG. 4 shows image encoding apparatus using subband coding, which apparatus generically is of a type described by E. H. Adelson and E. P. M. Simoncelli in their concurrently filed U.S. patent application Ser. No. 045,987 entitled "Truncated Subband Coding of Images" and assigned to RCA Corporation. The FIG. 4 image encoding apparatus has one first-stage QMF bank 100 and one second-stage QMF bank 200 for performing the first and second of iterated analysis procedures, respectively, on a two-dimensional input signal $G(z_1, z_2)$. Modifications of this apparatus having a multiplicity of stages for performing more than two iterated analysis procedures are possible and indeed desirable up to three or four stages. There is seldom much advantage of five or more stages since usually most of the coding reduction for images lies in the higher spatial-frequency bands.

Recognition of the fact that usually most of the coding reduction for images lies in the higher spatial-frequency bands underlies the differences between the apparatus shown in FIG. 4 and image encoding apparatus prior to Adelson and Simoncelli which used QMF banks in tree connections. In the apparatus prior to Adelson and Simoncelli the $y_{11}$, $y_{12}$, $y_{21}$ and $yz_{22}$ responses of the first-stage QMF bank 100 are all subjected to further analysis before coding, these further analyses being done in a second rank of four second-stage QMF banks. In the Adelson and Simoncelli apparatus only the low-pass spatial-frequency filter response $y_{11}$ is forwarded to a second-stage QMF bank 200, for further analysis. The oriented high-pass spatial-frequency filter responses $y_{12}$, $y_{21}$ and $y_{22}$ are supplied directly to encoders 301, 302 and 303 respectively without further analysis.

The apparatus shown in FIG. 4 uses only a first-stage QMF bank 100 and a second-stage QMF bank 200 for analysis, so second-stage QMF bank 200 is also the final-stage QMF bank for analysis. The low-pass spatial-frequency filter response of the final stage (here, $y_{11\text{-}11}$) is supplied to an encoder 304 as well as its spatially-oriented high-pass spatial-frequency filter responses (here, $y_{11\text{-}12}$, $y_{11\text{-}21}$ and $y_{11\text{-}22}$) being supplied to respective encoders 305, 306 and 307.

In modifications of this apparatus having further stages for analysis, the same rule of design is followed.

Suppose there is a plurality, p in number, of stages for analysis which are consecutively ordinally numbered first through $p^{th}$. In each stage except the final $P^{th}$ one, each of the three oriented high-pass spatial-frequency filter responses from the QMF bank of that stage are encoded without further spatial-frequency analysis, and the low-pass spatial-frequency filter response is used as input signal for the succeeding stage for analysis. In the final, $p^{th}$ stage, the low-pass spatial-frequency filter response and the three oriented high-pass spatial-frequency filter responses are all encoded without further spatial-frequency analysis. Encoders 301–307 preferably statistically encode, but may be other types of encoders (e.g., ones performing simple non-linear coding of amplitude values).

In FIG. 4, each of the elements 101 and 201 convolves the current row of samples supplied to its input with the low-pass filter kernel in the first dimension. Each of the elements 102 and 202 convolves the current row of samples supplied to its input with the complementary high-pass filter kernel in the first dimension. Each of the elements 103, 104, 203 and 204 is a decimator down-sampling 2:1 in the first dimension. These decimations are carried out in staggered phase, and the kernels used in these convolution processes each have an odd number of taps.

In respective spatial filtering operations each of the elements 105, 106, 205 and 206 convolves the low-pass filter kernel in the second dimension with the current sample and samples from a number of previous rows of samples supplied to its input. In respective spatial filtering operations each of the elements 107, 108, 207 and 208 convolves the high-pass filter kernel in the second dimension with the current sample and samples from a number of previous rows of samples supplied to its input. Each of the elements 109–112 and 209–212 is a decimator down-sampling 2:1 in the second, or column, dimension.

$H_1(z_2)$ and $H_1(-z_2)$ like $H_1(z_1)$ and $H_1(-z_1)$ have an odd number of taps. The decimations done in decimators 109 and 110 are done in staggered phase or antiphase with each other. So are the decimations done in decimators 111 and 112, the decimations done in decimator 203 and 204, the decimations done in decimators 209 and 210, and the decimations done in decimators 211 and 212.

The first dimension in the FIG. 4 encoding apparatus may be in the direction parallel to scan lines in a raster scanned input video signal $G(z_1, z_2)$ with spatial filtering for the second dimension being transversal filtering in the direction perpendicular to scan lines. In such case the pair of spatial filters 101 and 102 and the pair of spatial filters 201 and 202 will each take the form shown at the left of FIG. 2, up to and including sampling switch 48, with n being unity. The pair of spatial filters 105 and 107, the pair of spatial filters 106 and 108, the pair of spatial filters 205 and 207, and the pair of spatial filters 206 and 208 will also take this form, but with n being the number of samples per scan line, so as to carry out transversal spatial filtering.

Alternatively, the first dimension in the FIG. 4 encoding apparatus may be in the direction perpendicular to scan lines in a raster scanned input video signal $G(z_1, z_2)$, and the second dimension may be in the direction parallel to scan lines. In such case the pair of spatial filters 101 and 102 and the pair of spatial filters 201 and 202 each take the form shown at the left of FIG. 2, up to and including sampling switch 48, with n being the number of samples per scan line, so as to carry out transversal spatial filtering. The pair of spatial filters 105 and 107, the pair of spatial filters 106 and 108, the pair of spatial filters 205 and 207, and the pair of spatial filters 206 and 208 will also take this form, but with n equalling unity.

The separable two-dimensional filters shown in FIG. 4 use the same kernel in each of the row and column dimensions. Separable two-dimensional spatial filtering can also be done with different kernels in the row convolutions than in the column convolutions.

Figure 5:
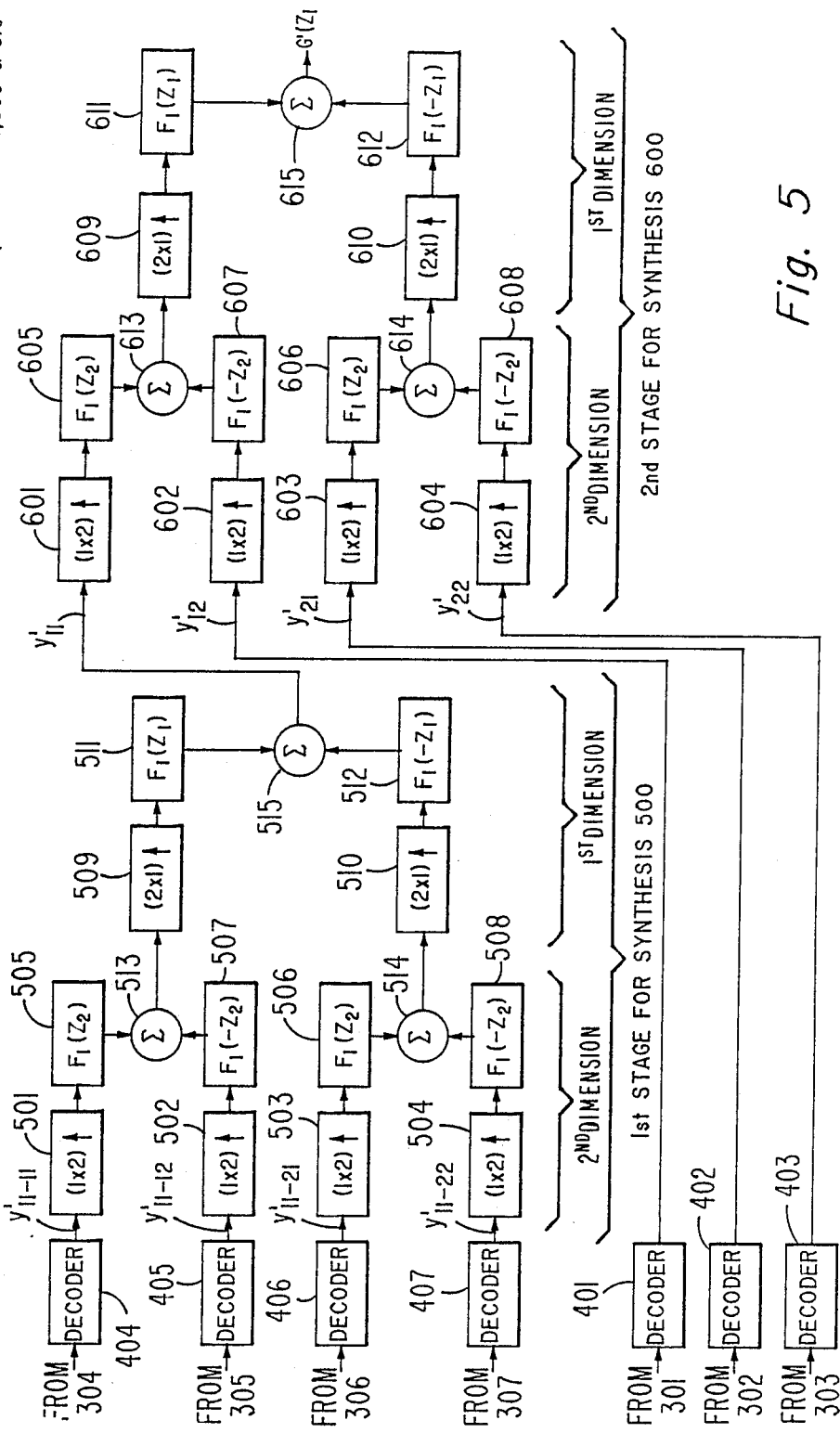
FIG. 5 is a schematic diagram of apparatus for decoding the subband encoding of the FIG. 4 apparatus, in which one may use the apparatus of the invention.

FIG. 5 shows apparatus for reconstructing a replica $G'(z_1, z_2)$ of the original image data $G(z_1, z_2)$, proceeding from the codes generated responsive to $G(z', z_2)$ by encoders 301–307 of the apparatus shown in FIG. 4. The image reconstruction apparatus includes decoders 401–407 for decoding the codes originating from encoders 301–307 respectively.

The interface between the encoders 301–307 and the decoders 401–407 generally includes code synchronization apparatus. This code synchronization may provide for time-division-multiplexing of the code streams during transmission over a single channel, rather than the code streams being transmitted in parallel. In any case, allowance is made in the code synchronization apparatus for the further processing of $y_{11}$ as compared to $y_{12}$, $y_{21}$ and $y_{22}$ taking additional time in the two-dimensional spatial-filtering procedures both in the FIG. 4 apparatus and in the FIG. 5 apparatus.

The $y_{12}'$, $y_{21}'$, and $y_{22}'$ signals respectively recovered by decoders 401, 402 and 403 respectively resemble the $y_{12}$, $y_{21}$, $y_{22}$ signals respectively supplied encoders 301, 302 and 303, except for errors introduced in the encoding and decoding procedures. A $y_{11}'$ signal resembling the $y_{11}$ signal supplied to the second-stage QMF bank 200 for analysis has to be synthesized from the $y'_{11-11}$, $y'_{11-12}$, $y'_{11-21}$ and $y'_{11-22}$ signals recovered by decoders 404, 405, 406 and 407 respectively. This synthesis of $y_{11}'$ signal is performed in the first-stage QMF bank 500 for synthesis. The $y'_{11-11}$, $y'_{11-12}$, $y'_{11-21}$ and $y'_{11-22}$ signals from decoders 404–407 resemble the signals $y_{11-11}$, $y_{11-12}$, $y_{11-21}$ and $y_{11-22}$ supplied to encoders 304–307 except for errors introduced in the coding and decoding procedures. Each is up-sampled. This is done by padding each with interstitial rows and columns of null samples, then passing the expanded function through the same QMF bank used in its generation. Passing the padded signals through the QMF bank suppresses the aliasing introduced in the padding process These procedures can be carried out separately.

More particularly, in the first-stage QMF bank 500 for synthesis, elements 501–504 are circuits for interleaving decoder output samples with null samples in the second dimension. Elements 505 and 506 convolve the samples supplied their inputs with the low-pass spatial-filtering kernel in the second dimension. Elements 507 and 508 convolve the samples supplied their inputs with the high-pass spatial-filtering kernel in the second dimension. Adders 513 and 514 reassemble the low-pass response and the high-pass response respectively supplied from the first dimension decimators 203 and 204 in the FIG. 4 apparatus. Elements 509 and 510 interleave the samples of these reassembled responses with null samples in that first dimension, in respective up-sampling procedures. Element 511 convolves the samples applied to its input with the low-pass spatial-filtering kernel in the first dimension. Element 512 convolves the samples applied to its input with the high-pass spatial-filtering kernel in the first dimension. The output signals from the convolvers 511 and 512 are summed in an adder 515 to generate y'₁₁ as output signal.

Where the first dimension is in the direction parallel to line scan, the pair of spatial filters 509 and 511 and the pair of spatial filters 609 and 610 will each be of the form shown at the right of FIG. 3 starting with sampling switch 49', with n equalling unity. The other pairs of spatial filters 501 and 502, 503 and 504, 601 and 602, and 603 and 604 will each be of the same form, but with n equalling the number of samples per scan line.

Where the second dimension is in the direction perpendicular to line scan, the pair of spatial filters 509 and 511 and the pair of spatial filters 609 and 610 will be constructed with n equalling the number of samples per scan line. The remaining pairs of spatial filters will be constructed with n equalling unity.

The final-stage QMF bank 600 for synthesis, here the second-stage QMF bank, is the same as the first-stage QMF bank 500 for synthesis. Elements 601–615 correspond in their operation to elements 501–515 except for increase in rate of operation reflective of the increase in sampling density of input data to elements 601–615.

In modifications of the apparatus shown in FIG. 5 of the patent drawing, additional stages for synthesis will resemble QMF banks 500 and 600 except for differences in operating rates. Other modifications of the FIG. 5 apparatus may be generated by using different low-pass and high-pass spatial-filtering kernels in the row and column dimensions. While different kernel functions are shown for coding and decoding in FIGS. 4 and 5, it is possible to use similar quadrature mirror filters for coding and decoding. This is particularly convenient when coding for two-way transmissions is done.

Still other modifications of the FIG. 5 decoding apparatus are generated by replacing one or more of the stages for synthesis in embodiments of the decoding invention thusfar described each with a respective stage for synthesis performing separate two-dimensional spatial filtering first in the row dimension and then in the column dimension.

What is claimed is:

1. A quadrature mirror filter bank in combination with a source of sampled-data input signal for separating said sampled-data input signal into first and second subband signals each sampled half as densely as said input signal, staggered in phasing respective to each other, and time-interleaved sample-by-sample in a quadrature mirror filter bank output signal, said quadrature mirror filter bank comprising:

a delay line having an odd numbered plurality of regularly spaced taps consecutively ordinally numbered from $-n^{th}$ to $+n^{th}$, where n is an integer greater than or equal to one, proceeding from the input end of the tapped delay line to its output end;

the $-n^{th}$ tap of said tapped delay line being receptive of sampled-data input signal;

means for summing the signals from each pair of taps having the same ordinal number except for sign, to generate a set of partial sum signals correspondingly ordinally numbered;

means for weighting the signal from the $0^{th}$ tap of said delay line and each of said even-numbered partial sum signals by respective weights to generate a first set of weighted partial sum signals;

means for summing together said first set of weighted partial sum signals to generate a first component of the quadrature mirror filter bank output signal;

means for weighting each of said odd-numbered partial sum signals by respective weights, to generate a second set of weighted partial sum signals;

means for summing together said second set of weighted partial sum signals to generate a second component of the quadrature mirror filter bank output signal; and means for combining samples of said first and second components of the quadrature mirror filter bank output signal appearing parallel in time, alternately additively combining and subtractively combining each successive pair of parallel-in-time samples, to generate said first and second subband signals respectively in said quadrature mirror filter bank output signal.

2. A subband coding encoding apparatus including, in addition to said combination as set forth in claim 1:

means for alternately sampling said quadrature mirror filter bank output signal thereby to separate said first and said subband signals from each other;

means for further encoding said first subband signal; and means for further encoding said second subband signal.

3. A subband coding encoding apparatus as set forth in claim 2 in combination with subband coding decoding apparatus comprising:

means for decoding said further encoded first subband signal to generate a recovered first subband signal;

means for decoding said further encoded first subband signal to generate a recovered second subband signal;

a further quadrature mirror filter bank similar in structure to said quadrature mirror filter bank in said subband coding encoding appartus;

means for alternatively sampling from said first and second subband signals to the $-n^{th}$ tap of said further quadrature mirror filter bank delay line whereby said further quadrature mirror bank is operative to supply a further quadrature mirror filter output signal resembling said sampled-data input signal.

* * * * *